(12) United States Patent
Wi et al.

(10) Patent No.: US 8,813,356 B2
(45) Date of Patent: Aug. 26, 2014

(54) METHOD FOR MANUFACTURING MAGNETIC SUBSTRATE AND COMMON MODE FILTER

(75) Inventors: Sung Kwon Wi, Seoul (KR); Jeong Bok Kwak, Gyeonggi-do (KR); Sang Moon Lee, Seoul (KR); Young Seuck Yoo, Seoul (KR); Yong Suk Kim, Gyeonggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 0 days.

(21) Appl. No.: 13/570,735

(22) Filed: Aug. 9, 2012

(65) Prior Publication Data

US 2013/0057378 A1 Mar. 7, 2013

(30) Foreign Application Priority Data

Sep. 5, 2011 (KR) .................. 10-2011-0089705

(51) Int. Cl.
| | | |
|---|---|---|
| H01R 43/02 | (2006.01) | |
| H01F 17/00 | (2006.01) | |
| H01F 27/28 | (2006.01) | |
| H01F 19/00 | (2006.01) | |
| H01F 27/24 | (2006.01) | |
| H01F 41/04 | (2006.01) | |
| H05K 1/02 | (2006.01) | |
| H05K 1/16 | (2006.01) | |
| H05K 3/46 | (2006.01) | |

(52) U.S. Cl.
CPC ........ H01F 17/0013 (2013.01); H01F 27/2804 (2013.01); H01F 27/288 (2013.01); *H01F 19/00* (2013.01); *H01F 27/24* (2013.01); *H01F 27/28* (2013.01); *H01F 41/042* (2013.01); *H05K 1/0233* (2013.01); *H05K 1/165* (2013.01); *H05K 3/4629* (2013.01)
USPC ............. 29/878; 29/592.1; 29/602.1; 29/521; 29/876; 210/222; 210/223; 210/335; 210/338; 333/181; 333/185; 333/200; 336/200; 336/232

(58) Field of Classification Search
CPC . H01F 17/0006; H01F 17/0013; H01F 17/04; H01F 19/00; H01F 27/24; H01F 27/28; H01F 27/2804; H01F 27/288; H01F 41/04; H01F 41/042; H05K 1/0233; H05K 1/165; H05K 3/4629
USPC ........... 29/521, 525.11, 592.1, 729, 739, 758, 29/764, 876; 210/222, 223, 335, 338, 440, 210/695; 310/313, 340, 344, 348; 333/185, 333/181, 200; 363/206
See application file for complete search history.

(56) References Cited

U.S. PATENT DOCUMENTS

| | | | |
|---|---|---|---|
| 8,058,964 B2 * | 11/2011 | Sato | ............................... 336/232 |
| 2007/0180684 A1 * | 8/2007 | Wada et al. | ................... 29/602.1 |

(Continued)

FOREIGN PATENT DOCUMENTS

| | | | |
|---|---|---|---|
| JP | 11-017483 A | | 1/1999 |
| JP | 2001119144 A | * | 4/2001 |
| JP | 2006-066848 A | | 3/2006 |
| JP | 2006-114801 A | | 4/2006 |

(Continued)

OTHER PUBLICATIONS

Japanese Office Action issued in Japanese Application No. 2012-180068 dated Jun. 3, 2014.

*Primary Examiner* — Paul D Kim

(74) *Attorney, Agent, or Firm* — McDermott Will & Emery LLP

(57) ABSTRACT

A common mode filter is manufactured to include a coil part including an insulation layer and a conductor pattern formed in the insulation layer; and a magnetic substrate coupled to one surface or both surfaces of the coil part. The magnetic substrate includes: an electrostatic absorbing layer made of an electrostatic absorbing material; a magnetic layer provided on one surface or both surfaces of the electrostatic absorbing layer and made of a magnetic material; and an electrode provided between the magnetic layer and the electrostatic absorbing layer and made of a conductive material. Therefore, common mode filter may maintain high efficiency characteristics while preventing an electrostatic discharge phenomenon.

13 Claims, 8 Drawing Sheets

(56) References Cited

U.S. PATENT DOCUMENTS

| | | | |
|---|---|---|---|
| 2011/0007438 A1* | 1/2011 | Ito et al. | 361/56 |
| 2011/0007439 A1* | 1/2011 | Asakawa et al. | 361/56 |
| 2012/0086538 A1* | 4/2012 | Chu | 336/206 |

FOREIGN PATENT DOCUMENTS

| | | |
|---|---|---|
| JP | 2008-186990 A | 8/2008 |
| JP | 2011-029575 A | 2/2011 |
| KR | 2010-0037000 A | 4/2010 |

* cited by examiner

METHOD FOR MANUFACTURING MAGNETIC SUBSTRATE AND COMMON MODE FILTER

CROSS REFERENCE(S) TO RELATED APPLICATIONS

This application claims the benefit under 35 U.S.C. Section 119 of Korean Patent Application Serial No. 10-2011-0089705, entitled "Magnetic Substrate, Common Mode Filter, Method for Manufacturing Magnetic Substrate and Method for Manufacturing Common Mode Filter" filed on Sep. 5, 2011, which is hereby incorporated by reference in its entirety into this application.

BACKGROUND OF THE INVENTION

1. Technical Field

The present invention relates to a magnetic substrate, a common mode filter, a method for manufacturing a magnetic substrate, and a method for manufacturing a common mode filter.

2. Description of the Related Art

As speed and functions of electronic devices tend to increase, the use of an interface for high speed data transmission has increased. Particularly, in a circuit for a high speed interface (USB2.0, USB 3.0, high-definition multimedia interface (HDMI), or the like) through a differential transmission scheme, a filter for removing common node noise is required.

Recently, as a frequency used for transmitting a signal tends to gradually move to a high frequency band and various portable electronic devices tend to be miniaturized and thinned, research into a small-sized and high-performance common mode filter has been conducted.

The common mode filter is generally configured to include a magnetic layer, a non-magnetic insulator layer, a conductor coil disposed in the non-magnetic layer, a lead terminal wire, and an external electrode connected to the lead terminal wire.

Meanwhile, in order to prevent a rapid change in voltage of the common mode filter, an electrostatic discharge (ESD) protecting element such as a varistor, or the like, has been used in the common mode filter.

A complex electronic component having a configuration in which inductor elements and ESD protecting elements are combined with each other has been disclosed in Patent Document 1.

However, the complex electronic component disclosed in Patent Document 1 is manufactured by simultaneously firing a magnetic material, an electrostatic absorbing layer, and an insulation layer including a conductor pattern. In this case, due to a difference in contraction rate between the respective layers, a problem such as printing bleeding, stack distortion, or the like, occurs, such that characteristics of the common mode filter are deteriorated.

RELATED ART DOCUMENT

Patent Document (Patent Document 1) Patent Document 1: Japanese Patent Laid-open Publication No. 2006-114801

SUMMARY OF THE INVENTION

An object of the present invention is to provide a magnetic substrate including an electrostatic absorbing layer and an electrode.

Another object of the present invention is to provide a common mode filter including a magnetic substrate including an electrostatic absorbing layer and an electrode and a coil part.

Still another object of the present invention is to provide a method for manufacturing the magnetic substrate and a method for manufacturing the common mode filter.

According to an exemplary embodiment of the present invention, there is provided a magnetic substrate including: an electrostatic absorbing layer made of an electrostatic absorbing material; a magnetic layer provided on one surface or both surfaces of the electrostatic absorbing layer and made of a magnetic material; and an electrode provided between the magnetic layer and the electrostatic absorbing layer and made of a conductive material.

The electrostatic absorbing material may be a zinc oxide (ZnO) based ceramic.

The magnetic material may be a ferrite of any one selected from a group consisting of Ni, Zn, Cu, and Mn.

The conductive material may be any one metal or an alloy of at least two metals selected from a group consisting of Ag, Cu, Al, Ni, Pd, and Ag—Pd.

According to another exemplary embodiment of the present invention, there is provided a common mode filter including: a coil part including an insulation layer and a conductor pattern formed in the insulation layer; and a magnetic substrate coupled to one surface or both surfaces of the coil part, wherein the magnetic substrate includes: an electrostatic absorbing layer made of an electrostatic absorbing material; a magnetic layer provided on one surface or both surfaces of the electrostatic absorbing layer and made of a magnetic material; and an electrode provided between the magnetic layer and the electrostatic absorbing layer and made of a conductive material.

According to still another exemplary embodiment of the present invention, there is provided a method for manufacturing a magnetic substrate, the method including: (A) forming a first magnetic layer made of a magnetic material; (B) forming a first electrode by printing a conductive material on the first magnetic layer; (C) stacking a first electrostatic absorbing layer made of an electrostatic protecting material on the first magnetic layer and the first electrode; and (D) simultaneously firing the first magnetic layer, the first electrode, and the first electrostatic absorbing layer.

The method may further include (X1) forming a second electrode by printing a conductive material on the first electrostatic absorbing layer between step (C) and step (D).

The method may further include (X2) stacking a second magnetic layer made of a magnetic material on the first electrostatic absorbing layer and the second electrode between step (X1) and step (D).

According to still another exemplary embodiment of the present invention, there is provided a method for manufacturing a common mode filter, the method including: providing a magnetic substrate; forming a first insulation layer on an upper surface of the magnetic substrate; forming a conductor pattern on the first insulation layer; applying an insulation material to upper surfaces of the first insulation layer and the conductor pattern; and curing the applied insulation material, wherein the providing of the magnetic substrate includes: (A) forming a first magnetic layer made of a magnetic material; (B) forming a first electrode by printing a conductive material on the first magnetic layer (C) stacking a first electrostatic absorbing layer made of an electrostatic protecting material on the first magnetic layer and the first electrode; and (D) simultaneously firing the first magnetic layer, the first electrode, and the first electrostatic absorbing layer.

The method may further include bonding a magnetic substrate to an upper surface of the cured insulation material after the curing of the insulation material.

The first insulation layer and the conductor pattern implementing characteristics of the common mode filter may be formed by using a thin film and thick film process.

The thin film and thick film process may be a process using a photolithography process in order to form the conductor pattern and a process of including and curing an insulation resin, an insulation glass, or the like, between layers of the conductor patterns and on upper and lower portions thereof.

DESCRIPTION OF THE PREFERRED EMBODIMENTS

Figure 1:
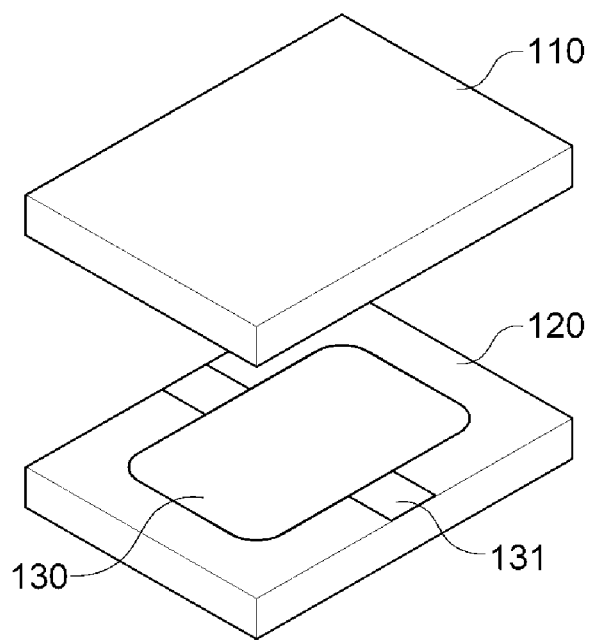
FIG. 1 is an exploded perspective view schematically showing a magnetic substrate according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a configuration and an acting effect of exemplary embodiments of the present invention will be described in more detail with reference to the accompanying drawings.

FIG. 1 is an exploded perspective view schematically showing a magnetic substrate 100 according to an exemplary embodiment of the present invention.

Referring to FIG. 1, the magnetic substrate 100 according to the exemplary embodiment of the present invention may include an electrostatic absorbing layer 110, a magnetic layer 120, and an electrode 130.

The electrostatic absorbing layer 110 may be made of an electrostatic absorbing material. Here, as the electrostatic absorbing material, a zinc oxide (ZnO) based ceramic may be used. The electrostatic absorbing layer 110 serves to buffer a rapid change in voltage in a common mode filter.

The magnetic layer 120 may be made of a magnetic material. Here, as the magnetic material, ferrite of any one selected from a group consisting of Ni, Zn, Cu, and Mn may be used.

The electrode 130 may be made of a conductive material. Here, as the conductive material, any one metal or an alloy of at least two metals selected from a group consisting of Ag, Cu, Al, Ni, Pd, and Ag—Pd may be used.

The electrode 130 is provided with a lead part 131, such that the electrode 130 is connected to a separate external terminal 60 connected to a ground terminal when the electrode 130 will be implemented later as a common mode filter, thereby making it possible to serve to discharge charges absorbed in the electrostatic absorbing layer 110.

Here, since the magnetic substrate 100 according to the present embodiment includes only a single electrode 130, another electrode 130 may be replaced by a conductor pattern 52 of the common mode filter.

Figure 2:
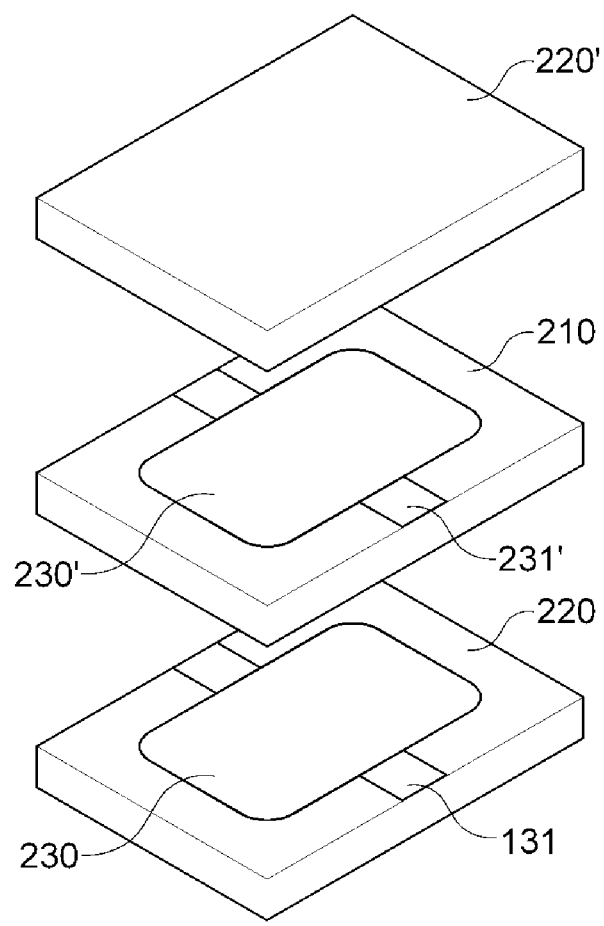
FIG. 2 is an exploded perspective view schematically showing a magnetic substrate according to another exemplary embodiment of the present invention.

FIG. 2 is an exploded perspective view schematically showing a magnetic substrate 200 according to another exemplary embodiment of the present invention.

Referring to FIG. 2, it may be appreciated that a magnetic substrate 200 may be implemented by forming an electrode 230' even on an upper surface of an electrostatic absorbing layer 210 and stacking a magnetic layer 220', unlike the case shown in FIG. 1.

Meanwhile, since the magnetic substrate 200 according to the present embodiment includes electrodes 230 and 230' provided on both surfaces of the electrostatic absorbing layer 210, capacitance may be generated. The capacitance may be controlled by implementing the electrode 230 so as to have various shapes.

Therefore, each of the magnetic substrates 100 and 200 according to the embodiment of the present invention may be introduced in manufacturing a common mode filter in a completed state in which it includes the electrostatic absorbing layers 110 and 210.

Figure 3:
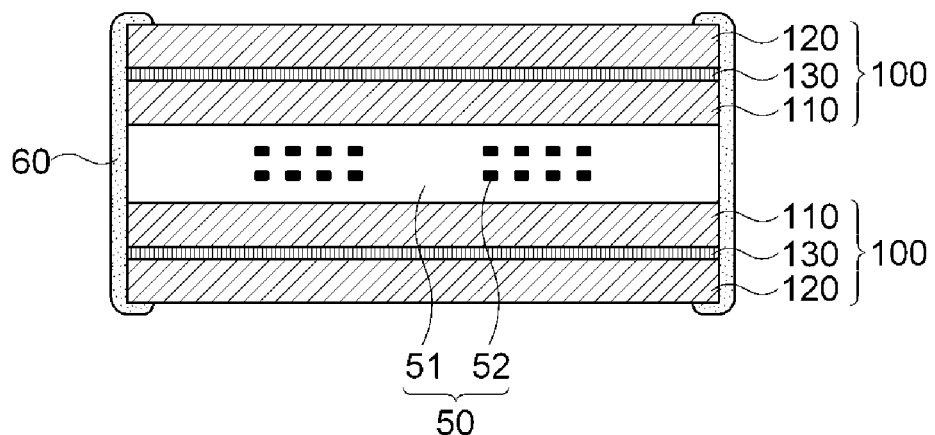
FIG. 3 is a cross-sectional view schematically showing a common mode filter according to an exemplary embodiment of the present invention.

FIG. 3 is a cross-sectional view schematically showing a common mode filter 300 according to an exemplary embodiment of the present invention.

Referring to FIG. 3, the common mode filter 300 according to the embodiment of the present invention may be implemented by forming a coil part 50 including an insulation layer 51 and a conductor pattern 52 on the above-mentioned magnetic substrate 100 and coupling an external terminal 60 to the magnetic substrate 100.

Figure 4:
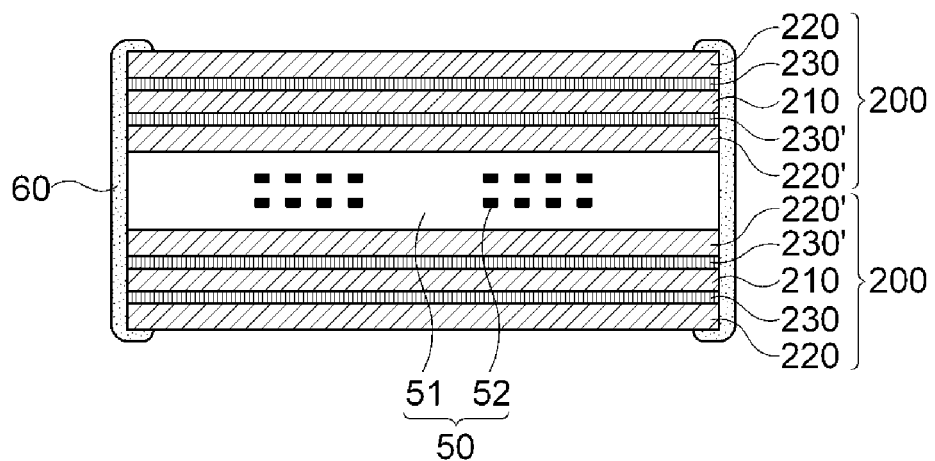
FIG. 4 is a cross-sectional view schematically showing a common mode filter according to another exemplary embodiment of the present invention.

FIG. 4 is a cross-sectional view schematically showing a common mode filter 400 according to another exemplary embodiment of the present invention.

Referring to FIG. 4, the common mode filter 400 according to another exemplary embodiment of the present invention may be implemented by forming a coil part 50 on the magnetic substrate 100 shown in FIG. 2 and coupling an external terminal 60 to the magnetic substrate 100.

Unlike the common mode filter according to the related art, in the common mode filters 300 and 400 according to the embodiment of the present invention, since the magnetic substrates 100 and 200 may be provided in a completed state, a problem such as a printing bleeding phenomenon of the conductor pattern 52, a distortion phenomenon due to a difference in contraction rate between layers, or the like, during a process of manufacturing the common mode filters 300 and 400 by forming the coil part 50 on the magnetic substrates 100 and 200 may be prevented in advance.

In addition, since there is no limitation on high temperature heat treatment such as a firing temperature during a process of forming the coil part 50, the insulation layer 51 may be made of various materials.

Figure 5:
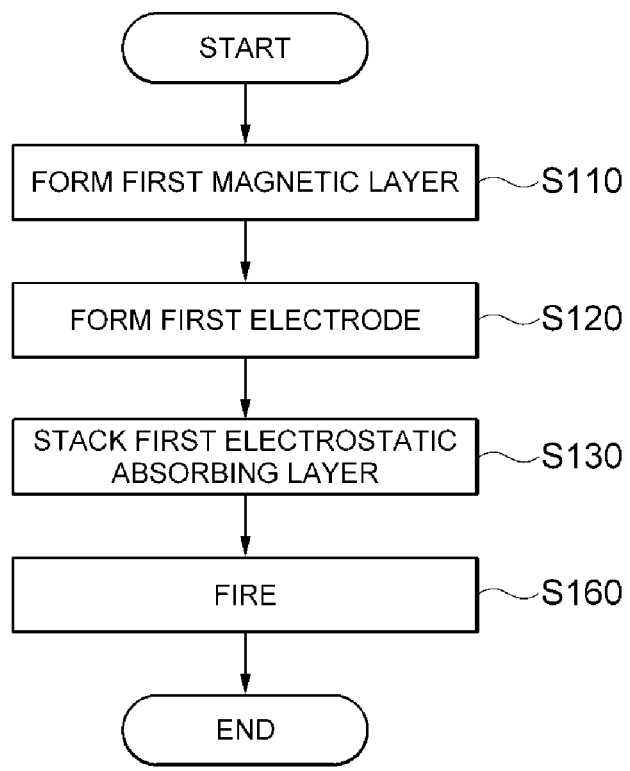
FIG. 5 is a flow chart schematically showing a method for manufacturing a magnetic substrate according to an exemplary embodiment of the present invention.

FIG. 5 is a flow chart schematically showing a method for manufacturing a magnetic substrate according to an exemplary embodiment of the present invention.

Referring to FIG. 5, a first magnetic layer made of a magnetic material is formed (S110).

Next, a first electrode is formed by printing a conductive material on the first magnetic layer (S120).

Then, a first electrostatic absorbing layer made of an electrostatic protecting material is stacked on the first magnetic layer and the first electrode (S130).

Finally, all of the first magnetic layer, the first electrode, and the first electrostatic absorbing layer are simultaneously fired (S160).

Figure 6:
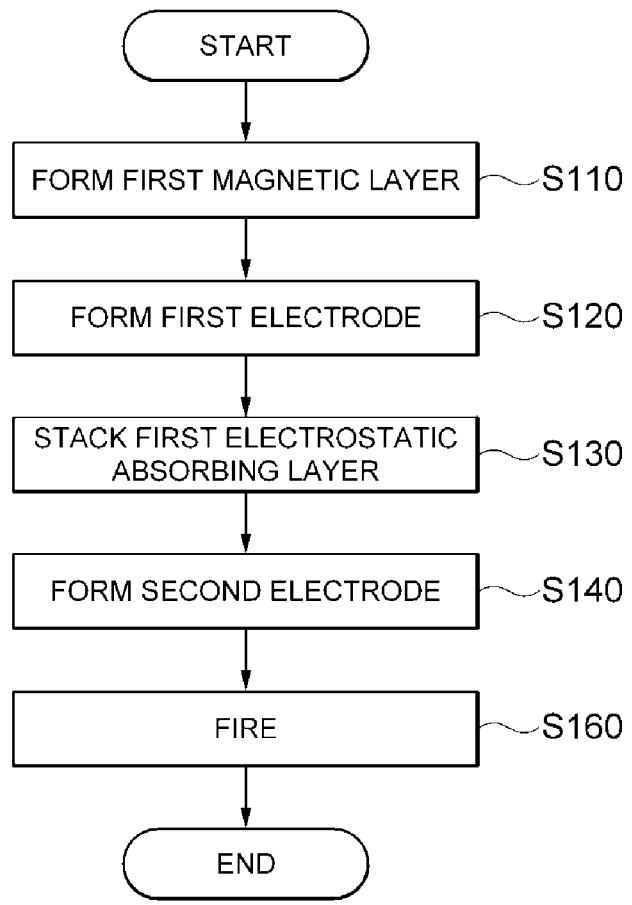
FIG. 6 is a flow chart schematically showing a method for manufacturing a magnetic substrate according to another exemplary embodiment of the present invention.

FIG. 6 is a flow chart schematically showing a method for manufacturing a magnetic substrate according to another exemplary embodiment of the present invention.

Referring to FIG. 6, after the first electrostatic absorbing layer is stacked (S130), a second electrode may be formed by printing a conductive material on the first electrostatic absorbing layer (S140).

Therefore, charges absorbed in the first electrostatic absorbing layer by the first and second electrodes may move to a ground terminal.

Figure 7:
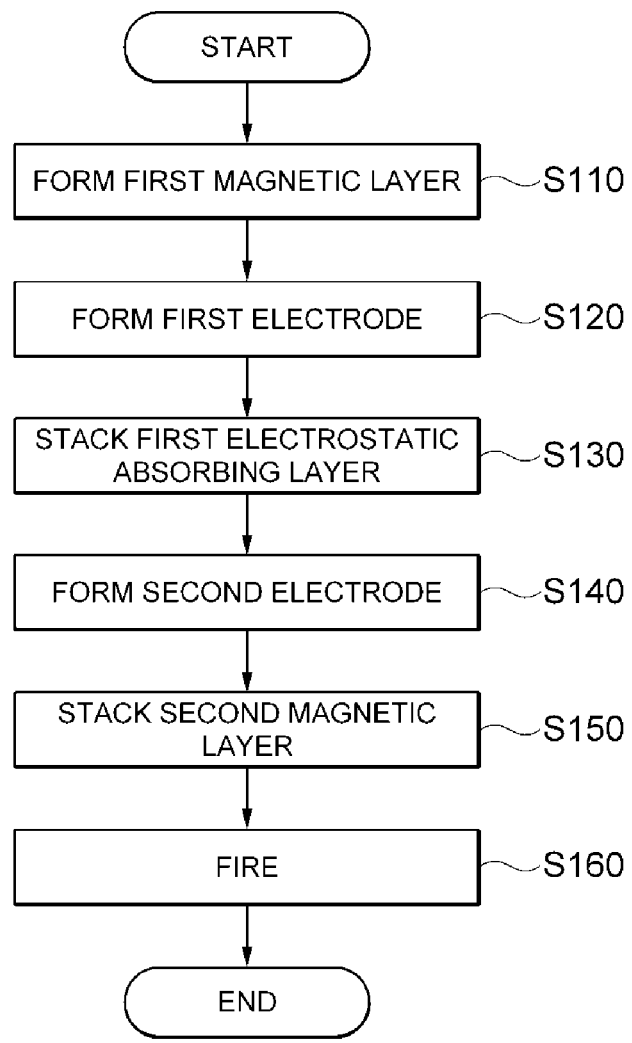
FIG. 7 is a flow chart schematically showing a method for manufacturing a magnetic substrate according to still another exemplary embodiment of the present invention.

FIG. 7 is a flow chart schematically showing a method for manufacturing a magnetic substrate according to still another exemplary embodiment of the present invention.

Referring to FIG. 7, after the second electrode is formed (S140), a second magnetic layer made of a magnetic material may be stacked on the first electrostatic absorbing layer and the second electrode (S150).

Figure 8:
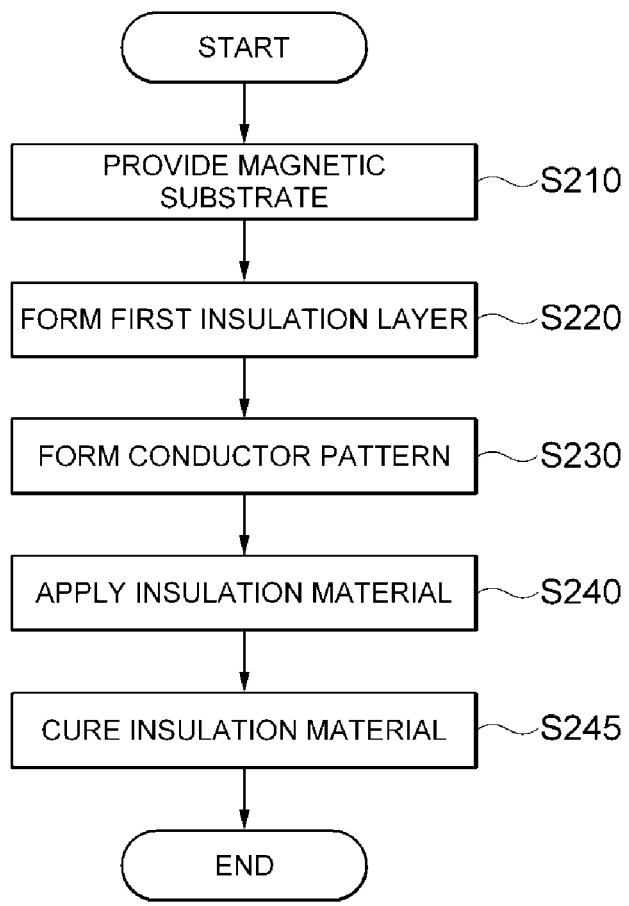
FIG. 8 is a flow chart schematically showing a method for manufacturing a common mode filter according to an exemplary embodiment of the present invention.

FIG. 8 is a flow chart schematically showing a method for manufacturing a common mode filter according to an exemplary embodiment of the present invention.

Referring to FIG. 8, according to the method for manufacturing a common mode filter according to the embodiment of the present invention, the magnetic substrate previously completed as described above is first provided (S210).

Next, a first insulation layer is formed on an upper surface of the magnetic substrate (S220).

Then, a conductive pattern is formed on the first insulation layer (S230).

Thereafter, an insulation material is applied to upper surfaces of the first insulation layer and the conductive pattern (S240).

Next, the insulation material in the previous operation is cured (S245).

Meanwhile, if necessary, processes of forming the conductive pattern and applying the insulation material are repeated two times or more, thereby making it possible to implement a coil part in which two or more layer conductor patterns are formed.

Figure 9:
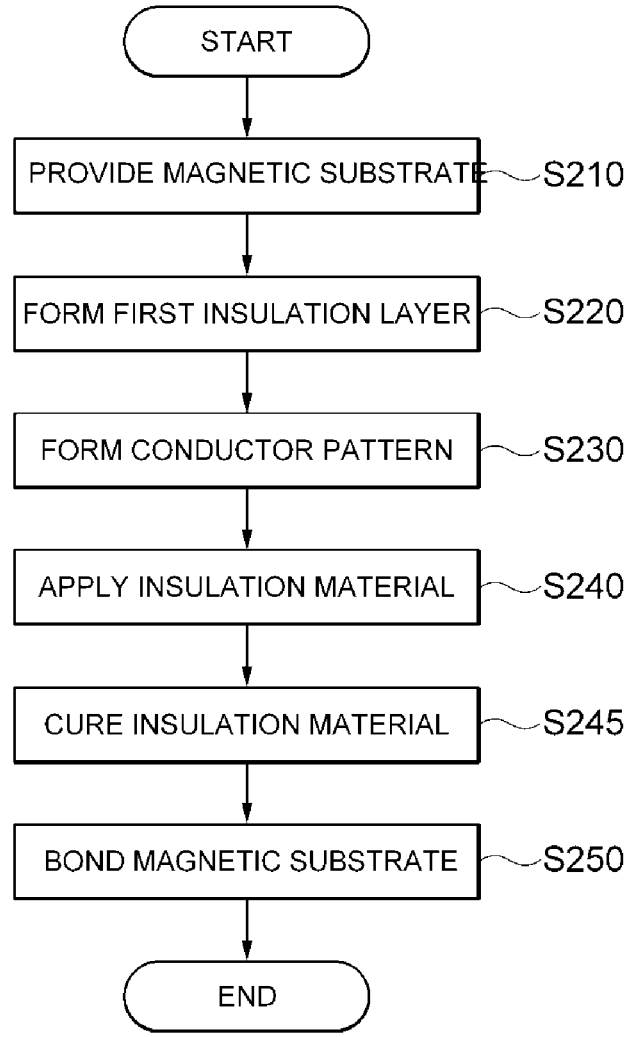
FIG. 9 is a flow chart schematically showing a method for manufacturing a common mode filter according to another exemplary embodiment of the present invention.

FIG. 9 is a flow chart schematically showing a method for manufacturing a common mode filter according to another exemplary embodiment of the present invention.

Referring to FIG. 9, after the insulation material is applied to the upper surfaces of the first insulation layer and the conductor pattern (S240) and is cured (S245), a magnetic substrate may be further bonded on an upper surface of the cured insulation material (S250).

Therefore, the magnetic substrate according to the embodiment of the present invention may be introduced in manufacturing a common mode filter in a completed state in which it includes the electrostatic absorbing layer.

Unlike the method for manufacturing a common mode filter according to the related art, in the method for manufacturing a common mode filter according to the embodiment of the present invention, since the magnetic substrate may be provided in a completed state, a problem such as a printing bleeding phenomenon of the conductor pattern, a distortion phenomenon due to a difference in contraction rate between layers, or the like, during a process of manufacturing the common mode filter by forming the coil part on the magnetic substrate may be prevented in advance.

In addition, since there is no limitation on high temperature heat treatment such as a firing temperature during a process of forming the coil part, the insulation layer may be made of various materials.

The magnetic substrate according to the embodiment of the present invention configured as described above may be manufactured by simultaneously firing the magnetic layer and the electrostatic absorbing layer. In addition, the coil part is formed on the magnetic substrate by a thin film process, thereby making it possible to prevent deterioration in characteristics of the common mode filter caused by printing bleeding, stack distortion, or the like, due to a difference in contraction rate between layers, which is a disadvantage according to the related art.

Further, the common mode filter according to the embodiment of the present invention may maintain high efficiency characteristics while preventing an electrostatic discharge phenomenon.

Further, with the method for manufacturing a magnetic substrate according to the embodiment of the present invention, the magnetic substrate including the magnetic layer and the electrostatic absorbing layer may be efficiently manufactured.

Moreover, with the method for manufacturing a common mode filter according to the embodiment of the present invention, the common mode filter capable of preventing an electrostatic discharge phenomenon while maintaining high efficiency characteristics may be efficiently manufactured.

Furthermore, since there is no limitation on high temperature heat treatment such as a firing temperature during a process of forming the coil part, the insulation layer may be made of various materials.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A method for manufacturing a magnetic substrate, the method comprising:
   (A) forming a first magnetic layer made of a magnetic material; (B) forming a first electrode by printing a conductive material on the first magnetic layer;
   (C) stacking a first electrostatic absorbing layer made of an electrostatic absorbing material on the first magnetic layer and the first electrode; and
   (D) simultaneously firing the first magnetic layer, the first electrode, and the first electrostatic absorbing layer.

2. The method according to claim 1, further comprising (X1) forming a second electrode by printing a conductive material on the first electrostatic absorbing layer between step (C) and step (D).

3. The method according to claim 2, further comprising (X2) stacking a second magnetic layer made of a magnetic material on the first electrostatic absorbing layer and the second electrode between step (X1) and step (D).

4. The method according to claim 1, wherein the electrostatic absorbing material of the first electrostatic absorbing layer is a zinc oxide (ZnO) based ceramic.

5. The method according to claim 1, wherein the magnetic material of the first magnetic layer is a ferrite of any one selected from a group consisting of Ni, Zn, Cu, and Mn.

6. The method according to claim 1, wherein the conductive material is any one metal or an alloy of at least two metals selected from a group consisting of Ag, Cu, Al, Ni, Pd, and Ag—Pd.

7. A method for manufacturing a common mode filter, the method comprising:
   providing a magnetic substrate;
   forming a first insulation layer on an upper surface of the magnetic substrate;
   forming a conductor pattern on the first insulation layer;
   applying an insulation material to upper surfaces of the first insulation layer and the conductor pattern; and
   curing the applied insulation material, wherein the providing of the magnetic substrate includes:
   (A) forming a first magnetic layer made of a magnetic material;
   (B) forming a first electrode by printing a conductive material on the first magnetic layer
   (C) stacking a first electrostatic absorbing layer made of an electrostatic absorbing material on the first magnetic layer and the first electrode; and
   (D) simultaneously firing the first magnetic layer, the first electrode, and the first electrostatic absorbing layer.

8. The method according to claim 7, further comprising bonding a magnetic substrate to an upper surface of the cured insulation material after the curing of the insulation material.

9. The method according to claim 7, further comprising (X1) forming a second electrode by printing a conductive material on the first electrostatic absorbing layer between step (C) and step (D).

10. The method according to claim 9, further comprising (X2) stacking a second magnetic layer made of a magnetic material on the first electrostatic absorbing layer and the second electrode between step (X1) and step (D).

11. The method according to claim 7, wherein the electrostatic absorbing material of the first electrostatic absorbing layer is a zinc oxide (ZnO) based ceramic.

12. The method according to claim 7, wherein the magnetic material of the first magnetic layer is a ferrite of any one selected from a group consisting of Ni, Zn, Cu, and Mn.

13. The method according to claim 7, wherein the conductive material is any one metal or an alloy of at least two metals selected from a group consisting of Ag, Cu, Al, Ni, Pd, and Ag—Pd.

* * * * *